US011960033B2

(12) United States Patent
Mellot

(10) Patent No.: US 11,960,033 B2
(45) Date of Patent: Apr. 16, 2024

(54) SPAD BASED INDIRECT TIME OF FLIGHT SENSING FROM SOLID STATE TRANSMITTER SCANNING

(71) Applicant: STMicroelectronics (Grenoble 2) SAS, Grenoble (FR)

(72) Inventor: Pascal Mellot, Lans en Vercors (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 18/126,165

(22) Filed: Mar. 24, 2023

(65) Prior Publication Data

US 2023/0243940 A1 Aug. 3, 2023

Related U.S. Application Data

(63) Continuation of application No. 16/862,792, filed on Apr. 30, 2020, now Pat. No. 11,635,498.

(51) Int. Cl.
*G01S 7/4914* (2020.01)
*G01S 7/4865* (2020.01)
*G01S 17/36* (2006.01)
*H01L 31/107* (2006.01)

(52) U.S. Cl.
CPC .......... *G01S 7/4914* (2013.01); *G01S 7/4865* (2013.01); *G01S 17/36* (2013.01); *H01L 31/107* (2013.01)

(58) Field of Classification Search
CPC ...... G01S 7/4914; G01S 7/4865; G01S 17/36; H01L 31/107
USPC ........................................................ 356/51
See application file for complete search history.

(56) References Cited

U.S. PATENT DOCUMENTS

| 2019/0113334 A1 | 4/2019 | Wolke et al. |
| 2019/0179028 A1 | 6/2019 | Pacala et al. |
| 2019/0277970 A1 | 9/2019 | Deane |
| 2019/0285750 A1 | 9/2019 | Mellot |
| 2019/0324143 A1 | 10/2019 | Gimpel |
| 2019/0353788 A1 | 11/2019 | Otsuka et al. |

(Continued)

FOREIGN PATENT DOCUMENTS

WO 2020023489 A1 1/2020

OTHER PUBLICATIONS

K. Yoshioka et al., "A 20-ch TDC/ADC Hybrid Architecture LiDAR SoC for 240×96 Pixel 200-m Range Imaging With Smart Accumulation Technique and Residue Quantizing SAR ADC," in IEEE Journal of Solid-State Circuits, vol. 53, No. 11, pp. 3026-3038, Nov. 2018, doi: 10.1109/JSSC.2018.2868315. (Year: 2018).*

(Continued)

*Primary Examiner* — Marnie A Matt
(74) *Attorney, Agent, or Firm* — Crowe & Dunlevy LLC

(57) ABSTRACT

Described herein is a time-of-flight ranging system and methods for its operation. The system includes an array of single photon avalanche diode (SPAD) pixels and control circuitry. The control circuitry simultaneously accumulates integrated SPAD event data from one cluster of SPAD pixels while integrating SPAD event data from another cluster during different target illuminations. The system also includes first and second VCSEL clusters, each responsible for a different target illumination. By processing and managing the data in this manner, the system can effectively reduce the time used to gather and analyze the event data, leading to faster and more accurate distance measurements.

17 Claims, 4 Drawing Sheets

(56) References Cited

U.S. PATENT DOCUMENTS

| | | |
|---|---|---|
| 2020/0158836 A1 | 5/2020 | Henderson et al. |
| 2020/0379095 A1 | 12/2020 | Kappel et al. |
| 2021/0247500 A1 | 8/2021 | Dehlinger et al. |
| 2021/0263137 A1 | 8/2021 | Dehlinger et al. |

OTHER PUBLICATIONS

Bronzi,D., et al: "CMOS SPAD Pixels for Indirect Time-of-Flight Ranging," IEEE Photonics Conference 2012, pp. 22-23, doi: 10.1109/IPCon.2012.6358469.

* cited by examiner

SPAD BASED INDIRECT TIME OF FLIGHT SENSING FROM SOLID STATE TRANSMITTER SCANNING

RELATED APPLICATION

This application is a continuation of United States application for patent Ser. No. 16/862,792, filed Apr. 30, 2020, the contents of which are incorporated by reference in their entirety.

TECHNICAL FIELD

This disclosure is directed to the field of time of flight depth sensing and, in particular, is directed to the use of a scanned solid state array of vertical cavity surface emitting lasers (VCSELs) in combination with a scanned array of single photon avalanche diodes (SPADs) so as create a time of flight depth sensor with greatly reduced power consumption.

BACKGROUND

Time of flight systems are used to measure distance to a target, and are therefore, among other applications, utilized in depth sensor modules. There are two general classifications of time of flight systems, namely direct and indirect.

With direct time of flight systems, a laser diode (typically infrared) is driven with a pulsed drive current to cause it to emit a short laser pulse in a given direction. This laser pulse is reflected by a possible object in that given direction, and a receiver receives and reads the reflected laser pulse. The receiver, with a proper timing reference, measures the elapsed time between emission of the laser pulse and receipt of the reflected laser pulse. From this elapsed time, the distance to the object can be evaluated.

With indirect time of flight systems, a laser diode (typically infrared) is continuously modulated to emit sinusoidal laser light in a given direction. This modulated sinusoidal laser light is reflected by a possible object in the given direction, and a receiver receives and reads the reflected sinusoidal laser light. The receiver compares the phase difference between the reflected sinusoidal laser light and the emitted sinusoidal laser light, and from this phase difference, the distance to the object can be determined.

These time of flight systems can be used to generate a depth map of the target. This depth map may be used to enhance photography, may be used in augmented and mixed reality applications, and may be in used in security applications. However, these time of flight systems are typically incorporated within smartphones and tablets, meaning that they are powered by batteries. Since battery power within a smartphone or tablet is a finite resource between recharges, it is desired to reduce power consumed by time of flight systems.

Current indirect time of flight systems typically use photodiodes (not SPADs) and such indirect time of flight to provide scalability with resolution. However, in order to scan out to distances of one or more meters in ambient light or to scan objects with low reflectance, flash illumination of the scene with multiple watts of optical power is utilized. In addition to consuming an undesirable amount of power, this makes it difficult to integrate the driver that generates the drive current for the laser diodes into a system on a chip.

As such, further development into these areas is needed.

SUMMARY

Disclosed herein is a time of flight ranging system including an array of single photon avalanche diode (SPAD) pixels, and control circuitry. The control circuitry is configured to cause the array of SPAD pixels to perform steps of: a) integrating SPAD event data received from each SPAD pixel of a first cluster of SPAD pixels during a first illumination of a target into counters, the first cluster of SPAD pixels being a subset of the array of SPAD pixels; b) integrating SPAD event data received from each SPAD pixel of a second cluster of SPAD pixels during a second illumination of the target into the counters, the second cluster of SPAD pixels being a subset of the array of SPAD pixels; c) at a start of integration of the SPAD event data received from each SPAD pixel of the second cluster of SPAD pixels, accumulating the integrated SPAD event data that was received from each SPAD of the first cluster of SPAD pixels into a first memory; d) integrating SPAD event data received from each SPAD pixel of the first cluster of SPAD pixels during a third illumination of the target into the counters; e) at a start of integration of the SPAD event data received from each SPAD pixel of the first cluster of SPAD pixels during the third illumination of the target, accumulating the integrated SPAD event data that was received from each SPAD pixel of the second cluster of SPAD pixels during the second illumination of the target into a second memory; f) integrating SPAD event data received from each SPAD pixel of the second cluster of SPAD pixels during a fourth illumination of the target into the counters; and g) at a start of integration of the SPAD event data received from each SPAD pixel of the second cluster of SPAD pixels during the fourth illumination of the target, accumulating the integrated SPAD event data that was received from each SPAD pixel of the first cluster of SPAD pixels during the third illumination of the target into the first memory. Steps a) to g) are performed a given number of times.

In some instances, steps a) to g) may be performed multiple times where the illuminations of the target are at multiple different frequencies of light.

Also disclosed herein is a time of flight ranging system, including: an array of single photon avalanche diode (SPAD) pixels; and control circuitry for, during different target illuminations, simultaneously accumulating integrated SPAD event data from a first cluster of SPAD pixels while integrating SPAD event data from a second cluster of SPAD pixels, and then simultaneously accumulating integrated SPAD event data from a second cluster of SPAD pixels while integrating SPAD event data from a first cluster of SPAD pixels.

The control circuitry may perform the simultaneous accumulation of integrated SPAD event data from the first cluster of SPAD pixels and integration of SPAD event data from the second cluster of SPAD pixels a given number of times.

The control circuitry may perform the simultaneous accumulation of integrated SPAD event data from the first cluster of SPAD pixels and integration of SPAD event data from the second cluster of SPAD pixels a first given number of times where the target illuminations are at a first frequency of light and the control circuitry may perform the simultaneous accumulation of integrated SPAD event data from the second cluster of SPAD pixels and integration of SPAD event data from the first cluster of SPAD pixels a second given number of times where the target illuminations are at a second frequency of light.

The control circuitry may cause the integration of the SPAD event data received from each SPAD pixel of the first cluster of SPAD pixels into counters. The control circuitry may cause the integration of the SPAD event data received from each SPAD pixel of the second cluster of SPAD pixels into the counters. The control circuitry may cause the accumulation of the integrated SPAD event data that was received from each SPAD of the first cluster of SPAD pixels into a first memory. The control circuitry may cause the accumulation of the integrated SPAD event data that was received from each SPAD of the second cluster of SPAD pixels into a second memory.

The control circuitry may be configured to determine a distance to the target by comparing a phase of the accumulated integrated SPAD event data to a phase of light that caused an associated illumination of the target.

The system may include first and second VCSEL clusters, with the first and second VCSEL clusters being distinct from one another. A first of the different target illuminations may be performed by the first VCSEL cluster and a second of the different target illuminations may be performed by the second VCSEL cluster.

The first and second clusters of SPAD pixels may be different subsets of an array of SPAD pixels.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
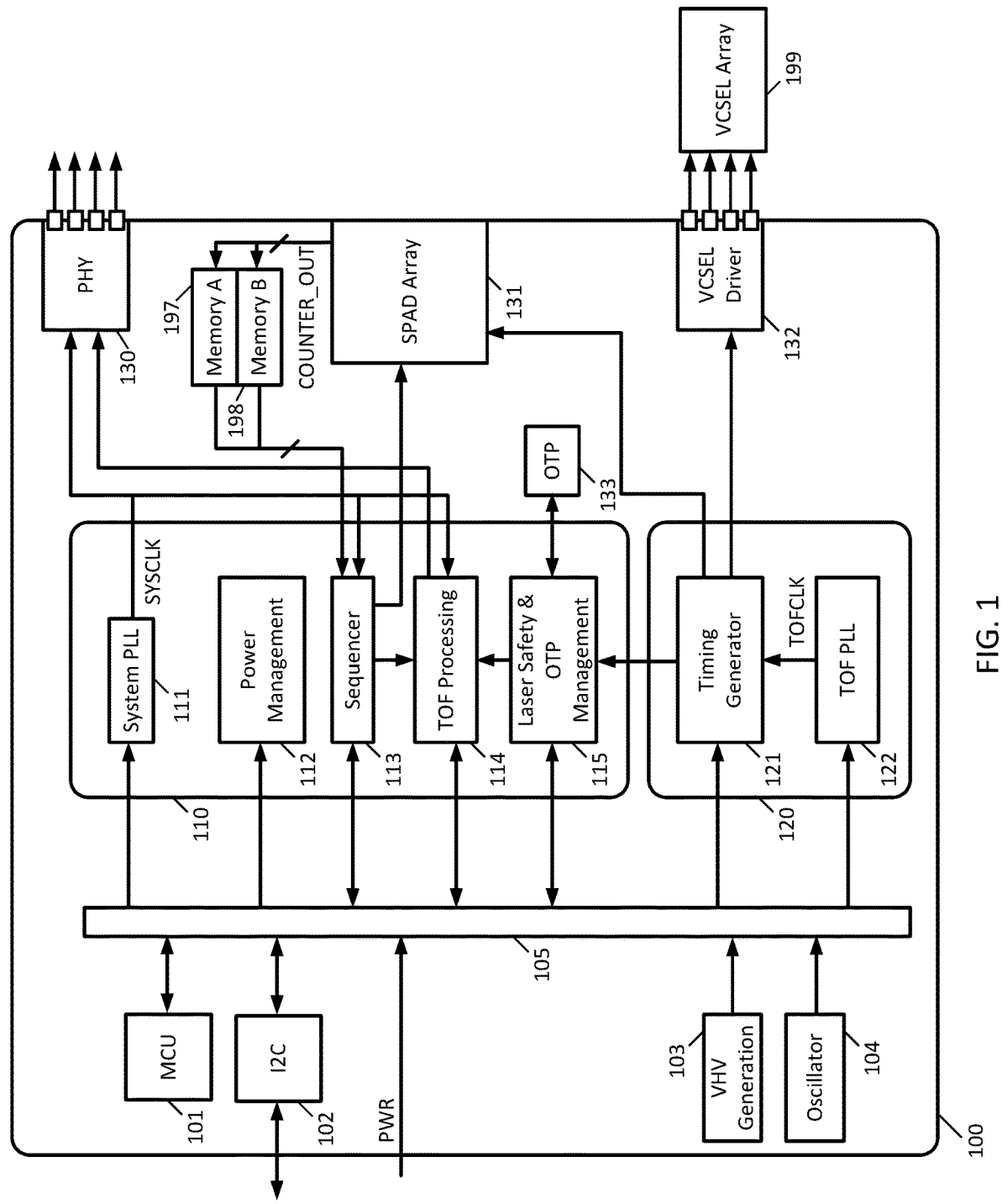
FIG. 1 is a block diagram of a time of flight ranging system disclosed herein.

Now described with reference to FIG. 1 is time of flight ranging system 100 formed by a stacked die arrangement. First, the structure and electrical connections of the time of flight ranging system 100 will be described, and then the functionality thereof will be described.

The time of flight ranging system 100 includes a microcontroller (MCU) 101, an I2C interface circuit 102, a high voltage generation (VHV) circuit 103, and an oscillator 104 connected through an interface 105 to a circuit block 110 and a circuit block 120.

The circuit block 120 includes a TOF PLL 122 that receives output from the oscillator 104 and generates a time of flight clock TOFCLK therefrom. A timing generator 121 receives the time of flight clock TOFCLK, and from it generates timing signals for the VCSEL driver 132 that drives a VCSEL array 199.

The circuit block 110 includes a system phase locked loop PLL 111 that receives output from the oscillator 104 over the interface 105 and generates therefrom a system clock SYSCLK. The circuit block 110 also includes a power management block 112 which receives a power signal PWR over the interface 105, a sequencer 113 that receives the system clock SYSCLK from the system PLL 111 and that receives instructions from the microcontroller 101 over the interface 105. From the received instructions, the sequencer 113 generates control signals for the TOF processing block 114.

A first memory (labeled as Memory A) 197 and a second memory (labeled as Memory B) 198 receive counter output COUNTER_OUT from the array of single photon avalanche diodes (SPADs) 131. The memories 197 and 198 are controlled by the sequencer 113 to integrate the data from SPAD array bin counters (described below), prior to the data being post-processed by a TOF processing unit 114

The TOF processing block 114 serves to process the integrated counts from the memories 197 and 198. The TOF processing block 114 is clocked by the system clock SYSCLK and can receive configuration information over the I2C interface 102. The TOF processing block 114 can also receive configuration information from a laser safety and one-time-programmable (OTP) memory management block 115. The one-time-programmable memory management block 115 receives data from the one-time-programmable memory 133, and receives timing input from the timing generator 121.

A physical interface 130 enables output from the TOF processing block 114 to be sent to external devices.

Figure 2A:
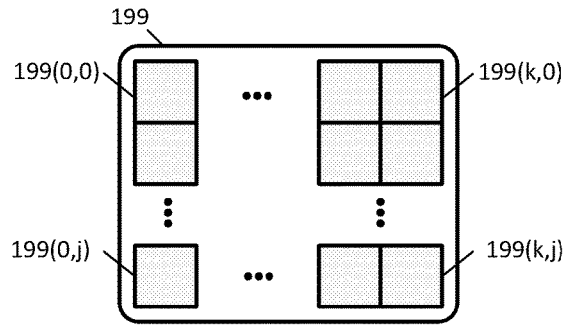
FIG. 2A is a diagram illustrating the diodes forming the VCSEL array of FIG. 1.

The VCSEL array 199 is now described in detail with respect to FIG. 2A. As can be seen in FIG. 2A, the VCSEL array 199 is a k by j array of VCSEL diodes, with rows being from 0 to j, and columns being from 0 to k. Therefore, the top leftmost VCSEL diode is labeled as 199(0,0), and the bottom rightmost VCSEL diode is labeled as 199(k,j).

Figure 2B:
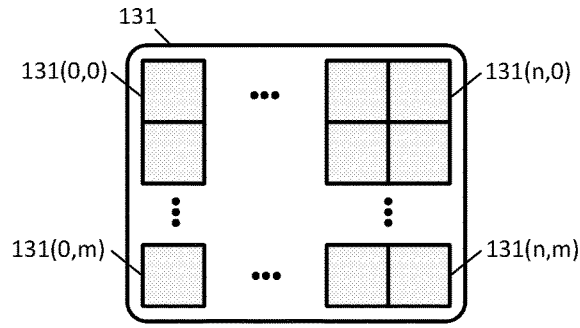
FIG. 2B is a diagram illustrating the pixels forming the SPAD array of FIG. 1.
Figure 2C:
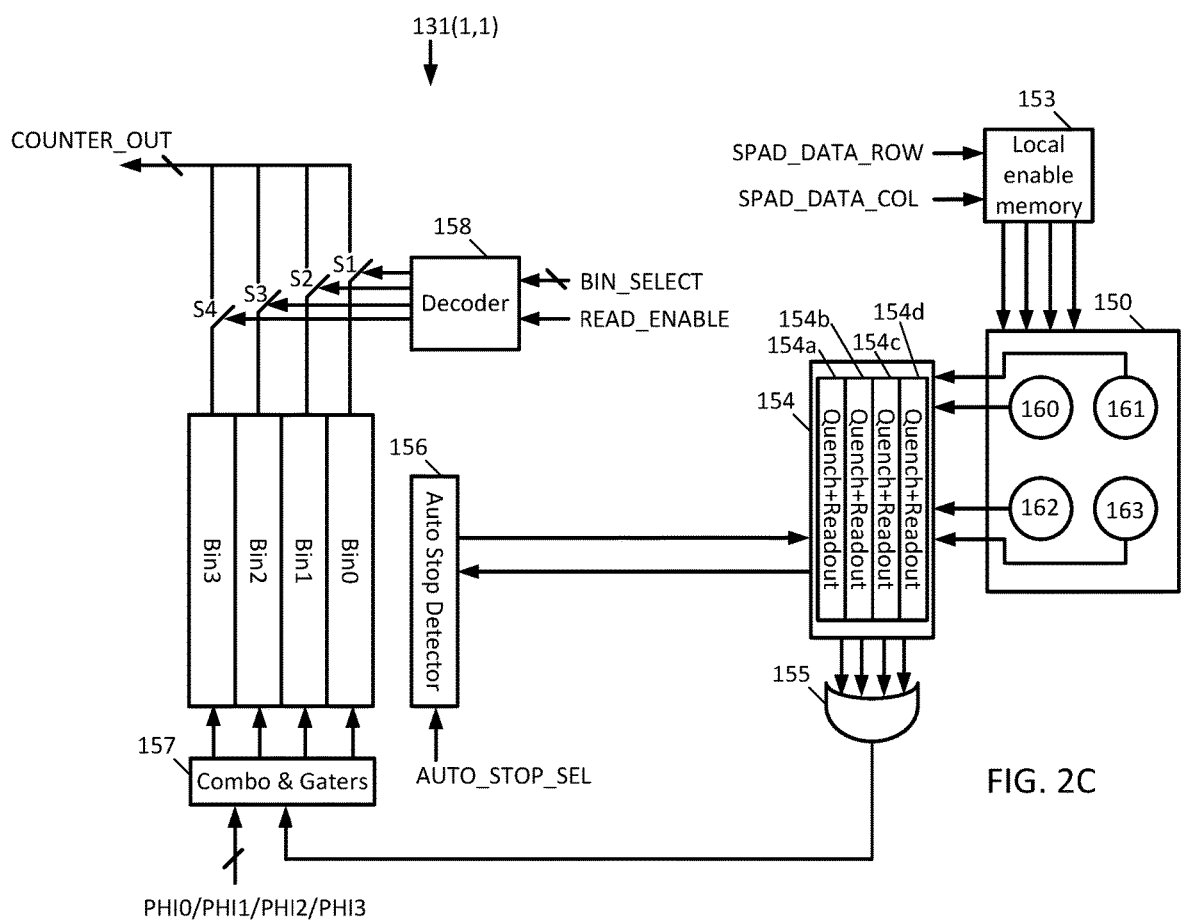
FIG. 2C is a schematic block diagram showing the structure of the SPAD pixels of the SPAD array of FIG. 1.

The SPAD array 131 is now described in detail with respect to FIGS. 2B-2C. As can be seen in FIG. 2B, the SPAD array 131 is an n by m array of SPAD pixels, with rows being from 0 to m, and columns being from 0 to n. Therefore, the top leftmost SPAD pixel is labeled as 131(0, 0), and the bottom rightmost SPAD pixel is labeled as 131(n,m). In an example embodiment, the SPAD array 131 has 246 columns (k=245) and 344 rows (j=343).

In the example shown, each pixel of the SPAD array 131 has the structure shown in FIG. 2C. Therefore, each pixel includes a 2×2 array of SPADs 150 (individually labeled as 160-163) that provides output to quench and readout circuitry 154. The quench and readout circuitry 154 is subdivided into four quench and readout subcircuits 154a-154d, each of which services an individual one of the SPADs 150. The quench and readout circuitry 154 provides output to an OR gate 155, which provides its output to combination and gating circuitry 157 that is controlled by four clock signals PHI0-PHI3 that are received from the timing generator 121. The combination and gating circuitry 157 in turn provides output to the bins BIN0-BIN3. The bins BIN0-BIN3 may be asynchronous counters, for example.

A decoder 158 is enabled by a read enable signal READ_ENABLE received from the sequencer 113, and operated based upon a BIN SELECT signal received from the sequencer 113 to selectively enable the switches S1-S4 to connect individual ones of the bins BIN0-BIN3 to the counter output COUNTER_OUT, which is fed (as shown in FIG. 1) to the TOF processing block 114.

Note that the quench and readout circuitry 154 is controlled by output from a local enable memory 153.

The local enable memory 153 receives a SPAD row selection signal SPAD_DATA_ROW and a SPAD column selection signal SPAD_DATA_COLUMN from the sequencer 113. The local enable memory 153 performs a lookup of configuration values based upon the SPAD_DATA_ROW and SPAD_DATA_COLUMN signals, and outputs the configuration values to selected ones of the quench and readout circuitries 154a-154d to thereby select appropriate SPAD pixels of the SPAD array 131 so as to select individual "clusters" (subsets of the pixels of the SPAD array 131). Auto stop detection circuitry 156 initially receives an auto stop selection signal AUTO_STOP_SEL from the sequencer 113, and this auto stop selection signal AUTO_STOP_SEL serves to set the threshold value at which the auto stop function of the auto stop detection circuitry 156 stops quenching and readout of the SPADs 160-163 by the quenching and readout circuitry 154. When any of the four values in BIN0-BIN3 reach the threshold value, the auto stop detection circuitry 156 stops quenching and readout of the SPADs by the quenching and readout circuitry 154.

Operation of the time of flight ranging system 100 will now be described. However, first, the timing of the four clock signals PHI0-PHI3 (generated by the sequencer 113) will be explained, and the grouping of the SPAD array 131 and VCSEL array 199 into the "clusters" to be individually selected during operation will be explained.

Figure 3:
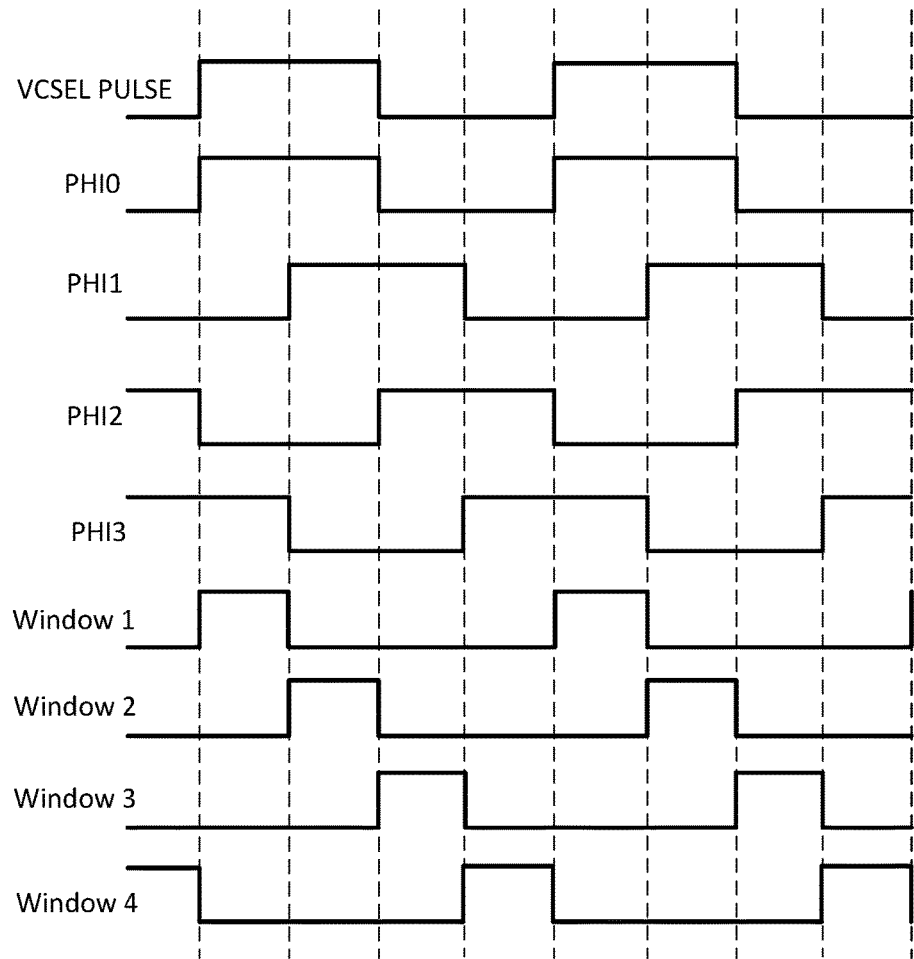
FIG. 3 is a timing diagram showing the relationship between the PHI clock signals and the VCSEL drive pulses, as well as illustrating the time windows utilized for SPAD event integration.

As shown in FIG. 3, PHI0 transitions high and low when the VCSEL drive pulse (generated by the VCSEL driver 132) transitions high and low; the clock signal PHI0 and the VCSEL drive pulse are therefore in phase. The clock signal PHI2 is the inverse of PHI0. The clock signal PHI1 is delayed in phase compared to PHI0 by one quarter of a period, and the clock signal PHI3 is the inverse of PHI1.

Four non-overlapping windows of time are formed per each period of the VCSEL drive pulse. A first window of time occurs between the rising edge of PHI0 and the rising edge of PHI1; a second window of time occurs between the rising edge of PHI1 and the rising edge of PHI2; a third window of time occurs between the rising edge of PHI2 and the rising edge of PHI3; and a fourth window of time occurs between the rising edge of PHI3 and the next rising edge of PHI0. The combination and gating circuitry 157 selectively routes the output from the OR gate 155 to specific ones of the counters BIN0-BIN3 based on the windows of time created by the PHI0-PHI3 signals.

Figure 4A:
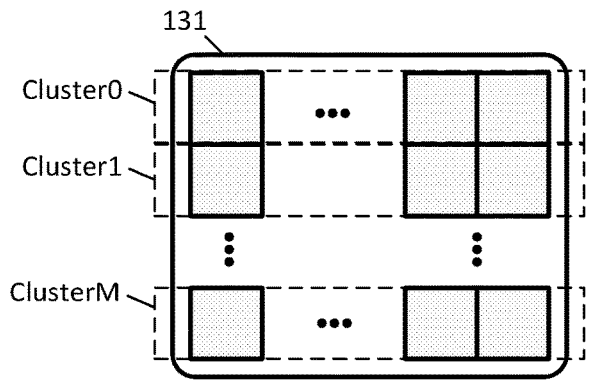
FIG. 4A is a diagram illustrating the formation of clusters from the pixels of the SPAD array of FIG. 2B.

The pixels of the SPAD array 131 may be grouped into "clusters" as shown in FIG. 4A, with Cluster® containing each pixel of the first row 131(0,0)-131(n,0), Cluster1 containing each pixel of the second row 131(0,1)-131(n,1), and continuing similarly until ClusterM contains each pixel of the mth row 131(0,m)-131(n,m). The illustrated example of each cluster containing a single row is made for sake of simplicity; in actual implementations, each cluster may contain any number of rows, for example, 16. Note that all rows in a given cluster accumulate in parallel.

Figure 4B:
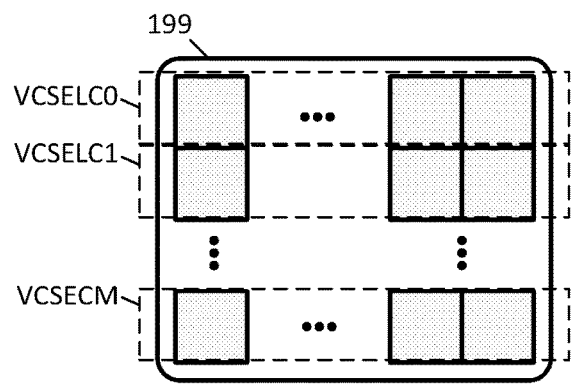
FIG. 4B is a diagram illustrating the formation of clusters from the pixels of the VCSEL array of FIG. 2A.

The diodes of the VCSEL array 199 may be divided into VCSEL "clusters" as shown in FIG. 4B, with VCSELC0 containing each diode of the first row 199(0,0)-199(n,0), VCSELC1 containing each diode of the second row 199(0,1)-199(n,1), and continuing similarly until VCSELCm contains each diode of the mth row 199(0,m)-199(n,m).

Operation, generally, proceeds by the sequencer 113 sending a signal to the timing generator 121 indicating which cluster is to be enabled at that time. The sequencer 113 in turn instructs the VCSEL driver 132 to drive the enabled cluster, while the timing generator 121 sends the PHI0-PHI4 signals to a corresponding one of the clusters of the SPAD array, to permit performance of indirect time of flight sensing during which the phase difference between the reflected sinusoidal laser light captured by the SPAD cluster and the sinusoidal laser light emitted from the VCSEL cluster is determined, and from this phase difference, the distance to the object can be determined.

Figure 5:
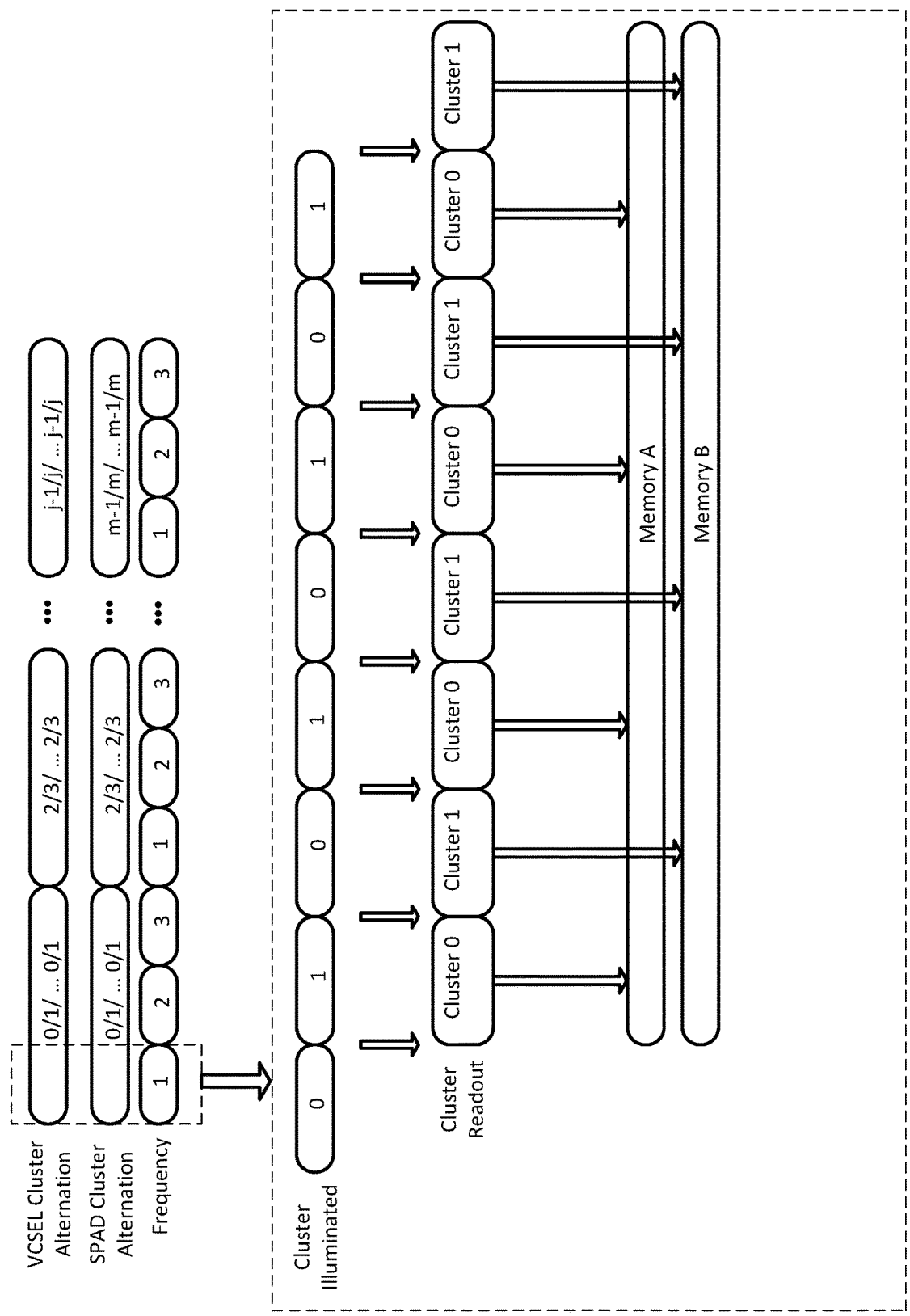
FIG. 5 is a diagram illustrating operation of the time of flight ranging system of FIG. 1.

As a detailed example, referring additionally to FIG. 5, the sequencer 113 causes the VCSEL driver 132 to drive a given VCSEL cluster (for example, VCSELC0) at a first frequency for performing indirect time of flight sensing. At the same time, the sequencer 113 suitably generates the SPAD_DATA_ROW and SPAD_DATA COL signals to the SPAD array 131 to select a corresponding given SPAD cluster (for example, Cluster0). During this iteration, the local enable memory 153 performs a lookup of configuration values based upon the SPAD_DATA_ROW and SPAD_DATA_COLUMN signals, and outputs the configuration values to the quench and readout circuitries 154a-154d to activate the quench and readout circuitries 154a-154d to read the individual SPADs 160-163 of each SPAD pixel of the SPAD cluster (here, Cluster0) and provide output to the OR gate 115. The output from the OR gate 115 is provided to one of the counters BIN0-BIN3 depending on the current time window. For example, during the first time window, the output of the OR gate 115 is integrated into the counter BIN0, during the second time window, the output of the OR gate 115 is integrated into the counter BIN1, during the third time window, the output of the OR gate 115 is integrated into the counter BIN2, and during the fourth time window, the output of the OR gate 115 is integrated into the counter BIN3.

Next, the sequencer 113 causes the VCSEL driver 132 to drive a next VCSEL cluster (for example, VCSELC1) at the first frequency. At the same time, the sequencer 113 suitably generates the SPAD_DATA_ROW and SPAD_DATA COL signals to the SPAD array 131 to select a corresponding next SPAD cluster (for example, Cluster1). Note that substantially simultaneously with this, the decoder 158 is enabled by the READ_ENABLE signal (generated by the sequencer 13), and appropriately operates the switches S1-S4 so that the counts contained in the counters BIN0-BIN3 of the prior selected SPAD cluster (here, Cluster0), are output as the COUNTER_OUT signal to the TOF processing circuit 114 and ultimately accumulated in the first memory 197.

Resultantly from the selection of the next SPAD cluster (here, Cluster1), the appropriate sub-circuits 154a-154d of the quench and readout circuitry 154 are activated to read the individual SPADs 160-163 of each SPAD pixel of the SPAD cluster (here, Cluster1) and provide output to the OR gate 115. The output from the OR gate 115 is provided to one of the counters BIN0-BIN3 depending on the current time window. For example, during the first time window, the output of the OR gate 115 is integrated into the counter BIN0, during the second time window, the output of the OR gate 115 is integrated into the counter BIN1, during the third time window, the output of the OR gate 115 is integrated into the counter BIN2, and during the fourth time window, the output of the OR gate 115 is integrated into the counter BIN3.

Next, the sequencer 113 causes the VCSEL driver 132 to drive the originally driven VCSEL cluster (here, VCSELC0) at the first frequency. At the same time, the sequencer 113 suitably generates the SPAD_DATA_ROW and SPAD_DATA COL signals to the SPAD array 131 to select the corresponding originally selected SPAD cluster (here, Cluster0). Note that substantially simultaneously with this, the decoder 158 is enabled by the READ_ENABLE signal (generated by the sequencer 13), and appropriately operates the switches S1-S4 so that the counts contained in the counters BIN0-BIN3 of the prior selected SPAD cluster (here, Cluster1), are output as the COUNTER_OUT signal to the TOF processing circuit 114 and ultimately accumulated in the second memory 198.

During this iteration, the sequencer 113 causes the appropriate sub-circuits 154a-154d of the quench and readout circuitry 154 read the individual SPADs 160-163 of each SPAD pixel of the SPAD cluster (here, Cluster0) and provide output to the OR gate 115. The output from the OR gate 115 is provided to one of the counters BIN0-BIN3 depending on the current time window. For example, during the first time window, the output of the OR gate 115 is integrated into the counter BIN0, during the second time window, the output of the OR gate 115 is integrated into the counter BIN1, during the third time window, the output of the OR gate 115 is integrated into the counter BIN2, and during the fourth time window, the output of the OR gate 115 is integrated into the counter BIN3.

Next, the sequencer 113 causes the VCSEL driver 132 to again drive the next VCSEL cluster (here, VCSELC1) at the first frequency. At the same time, the sequencer 113 suitably generates the SPAD_DATA_ROW and SPAD_DATA COL signals to the SPAD array 131 to again select the next SPAD cluster (here, Cluster1). Substantially simultaneously with this, the decoder 158 is enabled by the READ_ENABLE signal (generated by the sequencer 13), and appropriately operates the switches S1-S4 so that the counts contained in the counters BIN0-BIN3 of the prior driven SPAD cluster (here, Cluster0), are output as the COUNTER_OUT signal to the TOF processing circuit 114 and ultimately accumulated in the first memory 197.

Resultantly from the selection of the SPAD cluster (here, Cluster1), the sub-circuits 154a-154d of the quench and readout circuitry 154 read the individual SPADs 160-163 of each SPAD pixel of the SPAD cluster (here, Cluster1) and provide output to the OR gate 115. The output from the OR gate 115 is provided to one of the counters BIN0-BIN3 depending on the current time window. For example, during the first time window, the output of the OR gate 115 is integrated into the counter BIN0, during the second time window, the output of the OR gate 115 is integrated into the counter BIN1, during the third time window, output of the OR gate 115 is integrated into the counter BIN2, and during the fourth time window, the output of the OR gate 115 is integrated into the counter BIN3.

Therefore, notice that in operation, there is a repetition between two different associated SPAD/VCSEL clusters a given number of times. In the example illustrated in FIG. 5, there are four such repetitions between the Cluster0/VCSELC0 and the Cluster1/VCSELC1 at the first frequency.

Also notice that in FIG. 5, there are an additional four such repetitions between the Cluster0/VCSELC0 and Cluster1/VCSELC1, but with the VCSEL clusters being driven at the second frequency, and an additional four such repetitions between the Cluster0/VCSELC0 and Cluster1/VCSELC1, but with the VCSEL clusters being driven at the third frequency.

The multiple repeated integrations and accumulations serve to increase the dynamic range of the accumulated SPAD events, and serve to increase the signal to noise ratio of the accumulated SPAD events.

Once the desired number of repetitions between two different associated SPAD/VCSEL clusters (for example, between the Cluster0/VCSELC0 and Cluster1/VCSELC1) at a desired number of frequencies has been accomplished, then repetitions between two different associated SPAD/VCSEL clusters (for example, between the Cluster2/VCSELC2 and Cluster2/VCSELC2) at a desired number of frequencies is performed. This is continued until the desired number of repetitions between the final two different associated SPAD/VCSEL clusters (for example, between the Clusterm-1/VCSELCm-1 and Clusterm/VCSELCm) at a desired number of frequencies has been accomplished.

Using the above described technique of only activating a single VCSEL cluster and a single SPAD cluster at a time, power consumption of the time of flight system 100 is advantageously reduced because less power is supplied to the VCSEL array 199 than would be supplied with prior art flash style systems and less power is supplied to the SPAD array 131 than would be supplied with prior are flash style systems. Still further, since the results of the immediately prior integration are accumulated during the immediately successive integration, the amount of memory used by the time of flight system 100 is greatly reduced, as enough memory to accumulate only one cluster at a time is required.

Note that the number of repetitions between two different associated SPAD/VCSEL clusters that may be performed is inversely proportional to the frame rate of the indirect time of flight sensing to be performed.

Also note that the sizes and shapes of the clusters are entirely programmable via user input received over the I2C interface 102, which is then received and utilized by the sequencer 113 to generate the suitable SPAD_DATA_ROW and SPAD_DATA COL signals to form the desired clusters.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A time of flight ranging system, comprising:
an array of single photon avalanche diode (SPAD) pixels; and
control circuitry configured to, during different target illuminations, simultaneously accumulate integrated SPAD event data from a first cluster of SPAD pixels while integrating SPAD event data from a second cluster of SPAD pixels, and then simultaneously accumulate integrated SPAD event data from the second cluster of SPAD pixels while integrating SPAD event data from the first cluster of SPAD pixels.

2. The time of flight ranging system of claim 1, wherein the control circuitry performs the simultaneous accumulation of integrated SPAD event data from the first cluster of SPAD pixels and integration of SPAD event data from the second cluster of SPAD pixels a given number of times.

3. The time of flight ranging system of claim 1, wherein the control circuitry performs the simultaneous accumulation of integrated SPAD event data from the first cluster of SPAD pixels and integration of SPAD event data from the second cluster of SPAD pixels a first given number of times where the target illuminations are at a first frequency of light, and wherein the control circuitry performs the simultaneous accumulation of integrated SPAD event data from the second cluster of SPAD pixels and integration of SPAD event data from the first cluster of SPAD pixels a second given number of times where the target illuminations are at a second frequency of light.

4. The time of flight ranging system of claim 1,
   wherein the control circuitry integrates the SPAD event data received from each SPAD pixel of the first cluster of SPAD pixels into counters;
   wherein the control circuitry integrates the SPAD event data received from each SPAD pixel of the second cluster of SPAD pixels into the counters;
   wherein the control circuitry accumulates the integrated SPAD event data that was received from each SPAD of the first cluster of SPAD pixels into a first memory; and
   wherein the control circuitry accumulates the integrated SPAD event data that was received from each SPAD of the second cluster of SPAD pixels into a second memory.

5. The time of flight ranging system of claim 1, wherein the control circuitry is further configured to determine a distance to the target by comparing a phase of the accumulated integrated SPAD event data to a phase of light that caused an associated illumination of the target.

6. The time of flight ranging system of claim 1, further comprising first and second VCSEL clusters, wherein the first and second VCSEL clusters are distinct from one another; and wherein a first of the different target illuminations is performed by the first VCSEL cluster and a second of the different target illuminations is performed by the second VCSEL cluster.

7. The time of flight ranging system of claim 1, wherein the first and second clusters of SPAD pixels are different subsets of an array of SPAD pixels.

8. A method for operating a time of flight ranging system, comprising:
   a) integrating event data from a first single photon avalanche diode (SPAD) cluster during a first target illumination;
   b) integrating event data from a second SPAD cluster during a second target illumination; and
   at a start of b), accumulating event data that was integrated during a).

9. The method of claim 8, wherein event data from both the first and second SPAD clusters is integrated into counters, and the integrated event data of the first SPAD cluster is accumulated into a memory at the start of b).

10. The method of claim 8, further comprising:
    c) integrating event data from the first SPAD cluster during a third target illumination; and
    at a start of c), accumulating event data that was integrated during b).

11. The method of claim 10, wherein event data from both the first and second SPAD clusters is integrated into counters, the integrated event data of the first SPAD cluster is accumulated into a first memory at the start of b), and wherein the integrated event data of the second SPAD cluster is accumulated into a second memory at the start of c).

12. The method of claim 8, wherein the first target illumination is performed at a first frequency of light; and wherein the second target illumination is performed at a second frequency of light.

13. The method of claim 8, further comprising determining a distance to the target by comparing a phase of the accumulated integrated SPAD event data to a phase of light that caused the first target illumination.

14. A method for time-of-flight sensing, comprising:
   selectively driving each of VCSEL cluster of a plurality thereof at a predetermined frequency using a VCSEL driver generating a VCSEL drive pulse;
   controlling activation of the VCSEL clusters and a corresponding plurality of SPAD clusters using a sequencer;
   generating first, second, third, and fourth clock signals using a timing generator, wherein the first clock signal is in phase with the VCSEL drive pulse, wherein the third clock signal is an inverse of the first clock signal, wherein the second clock signal is delayed in phase compared to the first clock signal by one quarter of a period, and the fourth clock signal is an inverse of the second clock signal;
   selectively routing output from an OR gate, which combines outputs from quench and readout circuitries associated with the SPAD clusters, to specific counters associated with the SPAD clusters using combination and gating circuitry based on windows of time created by the first, second, third, and fourth clock signals;
   accumulating output of the counters for each SPAD cluster in a memory; and
   causing repeated integrations and accumulations of SPAD events between pairs of associated SPAD clusters and VCSEL clusters at a desired number of frequencies using the sequencer.

15. The method of claim 14, wherein a number of repetitions between pairs of associated SPAD clusters and VCSEL clusters is inversely proportional to a frame rate of the time-of-flight sensing to be performed.

16. The method of claim 14, wherein rows in a given SPAD cluster are accumulated in parallel.

17. The method of claim 15, further comprising performing the repetitions between pairs of associated SPAD clusters and VCSEL clusters at different VCSEL drive pulse frequencies, wherein the different VCSEL drive pulse frequencies are varied during operation.

* * * * *